(12) United States Patent
Miki

(10) Patent No.: US 7,205,853 B2
(45) Date of Patent: Apr. 17, 2007

(54) METHOD TO CONFIGURE PHASE-LOCKED LOOP DIVIDING RATIO

(75) Inventor: Kazuhiko Miki, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 81 days.

(21) Appl. No.: 11/091,262

(22) Filed: Mar. 28, 2005

(65) Prior Publication Data

US 2006/0214735 A1    Sep. 28, 2006

(51) Int. Cl.
*G01R 23/00*   (2006.01)
*H03L 7/08*    (2006.01)
*H03L 7/085*   (2006.01)

(52) U.S. Cl. .............................. 331/44; 331/14; 331/16; 331/25

(58) Field of Classification Search ................ 331/1 A, 331/10, 11, 14, 16, 18, 25, 44, DIG. 2
See application file for complete search history.

(56) References Cited

U.S. PATENT DOCUMENTS 5,583,875 A    12/1996   Weiss
6,104,251 A    8/2000    Ramey et al.
6,512,419 B1   1/2003    Adams et al.
6,686,804 B1*  2/2004    Adams et al. ................ 331/17

FOREIGN PATENT DOCUMENTS

| JP | 06-244718    | 9/1994 |
| JP | 10-041812    | 2/1998 |
| JP | 2000-124800  | 4/2000 |
| JP | 2002-198811  | 7/2002 |
| JP | 2003-069423  | 3/2003 |

* cited by examiner

*Primary Examiner*—David Mis
(74) *Attorney, Agent, or Firm*—Sprinkle IP Law Group

(57) ABSTRACT

A system and method for configuring a phased-lock loop (PLL) dividing ratio which does not require the phased-lock loop circuit to lock. In one embodiment, the method includes inducing a substantially minimum or a substantially maximum frequency output from a voltage-controlled oscillator (VCO), and configuring a divider with a corresponding dividing ratio. The method may include grounding an input voltage to the VCO. Alternately, the method may include manipulating inputs to a charge pump providing input to the VCO. The charge pump inputs may be manipulated directly or through a phase-frequency detector providing input to the charge pump and adapted to receive additional input signals.

13 Claims, 6 Drawing Sheets

METHOD TO CONFIGURE PHASE-LOCKED LOOP DIVIDING RATIO

TECHNICAL FIELD OF THE INVENTION

The present invention relates generally to phase-locked loop (PLL) circuits, and more particularly, to configuring a dividing ratio of a PLL circuit.

BACKGROUND OF THE INVENTION

Phase-locked loop (PLL) integrated circuits produce an oscillator frequency output which matches an input frequency signal. A typical PLL may include a phase-frequency detector, a charge pump, and a voltage-controlled oscillator.

Phase-locked loops are widely used in digital electronics, signal telemetry, and communications applications. Many applications require phase-locked loop (PLL) circuits which will work with high frequencies. PLL circuits can have a high sensitivity to manufacturing process variation. In particular, the voltage-controlled oscillators (VCO) are often sensitive to process variation. Thus, process yields of PLL circuits requiring high frequency operation may be reduced due to VCO frequency ranges which are out of specification. While test techniques can be used to combat this problem, the total test time significantly influences the cost of manufacturing. Accordingly, it is desirable to configure PLL circuits with an optimized test process flow and a minimized test time.

SUMMARY OF THE INVENTION

A method for configuring a phase-locked loop (PLL) circuit which includes inducing a frequency output from a voltage-controlled oscillator (VCO) and setting a dividing ratio for a PLL divider based on the frequency output. In one embodiment, the frequency output for a particular PLL may be attained after some settling time, and the frequency output may be a substantially minimum or a substantially maximum for that particular PLL. In one embodiment, the method includes manipulating inputs to a charge pump, where the charge pump provides input to the voltage-controlled oscillator. A control signal may be provided, where the control signal manipulates the inputs to the charge pump such that the induced frequency output for the VCO in the PLL circuit is a relative minimum frequency when the control signal is unasserted, and the induced frequency output for the VCO in the PLL circuit is a relative maximum frequency when the control signal is asserted. In the embodiment, the method may include adapting a phase-frequency detector to receive as inputs the test signal and the control signal. The phase-frequency detector is arranged such that its outputs are coincident with the inputs to the charge pump.

In another embodiment, the method includes pulling to ground an input voltage to the voltage-controlled oscillator, thus producing a minimum output frequency. In this embodiment, a test signal gates circuitry arranged between ground and the input voltage node to the voltage-controlled oscillator. The input voltage to the VCO goes to ground when the test signal is high, and the PLL operates normally when the test signal is low.

In one embodiment, the method may include providing a tester adapted to removably interface with the PLL circuit, where the tester is configured to induce and measure an induced frequency output from a voltage-controlled oscillator.

A system for configuring a phase-locked loop (PLL) circuit which includes a voltage-controlled oscillator and a user-configurable divider, where the oscillator is adapted to provide an induced frequency output when a test-signal is asserted and where the divider is configured with a dividing ratio based upon the induced frequency output. The divider may include fuse bits which set the dividing ratio according to the induced frequency. The system may include a charge pump configured to provide an induced voltage output to a voltage-controlled-oscillator input. The system may also include a phase-frequency detector adapted to receive control and test signal inputs and to provide input to the charge pump.

An improved method for manufacturing phase-locked loop (PLL) circuits wherein to improve yields, PLL circuits are evaluated chip by chip and appropriate dividing ratios are selected on a chip by chip basis according to PLL induced frequency response. Thus, a larger range of PLL frequency responses may be within specification and PLL manufacturing yields may increase accordingly.

To reduce test time, the need to lock the PLL circuits is eliminated. Determining at least one relative extreme frequency response for a voltage-controlled oscillator eliminates the need to lock the PLL circuit to determine an appropriate dividing ratio. The improved method provides an optimized test flow and a minimized test time.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore nonlimiting, embodiments illustrated in the drawings, wherein identical reference numerals designate the same components. Note that the features illustrated in the drawings are not necessarily drawn to scale.

DETAILED DESCRIPTION

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. After reading the specification, various substitutions, modifications, additions and rearrangements will become apparent to those skilled in the art from this disclosure which do not depart from the scope of the appended claims.

Figure 1:
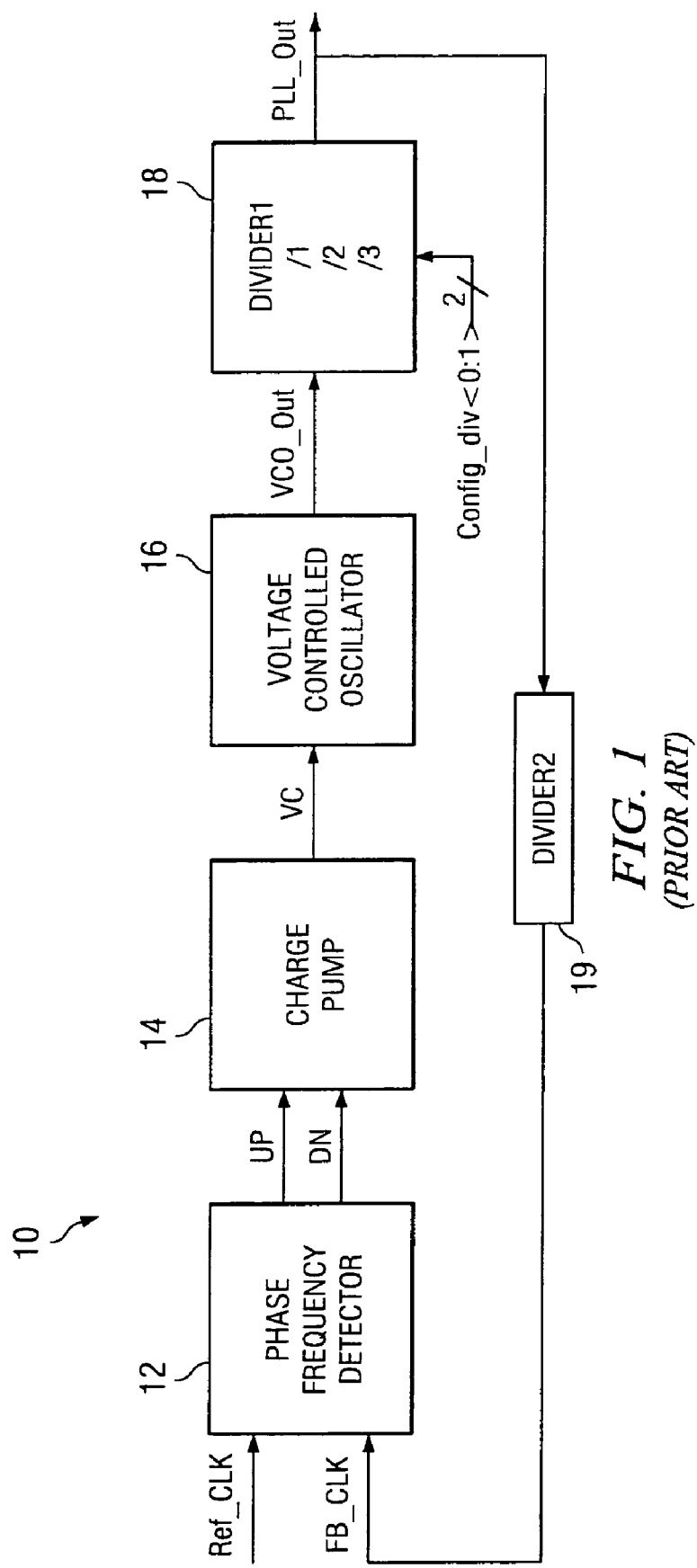
FIG. 1 is a block diagram of a typical phase-locked loop circuit.

FIG. 1 is a block diagram of a typical phase-locked loop (PLL) circuit. PLL 10 includes phase-frequency detector (PFD) 12. PFD 12 detects the difference in phases and frequencies of two input signals, Ref_CLK and FB_CLK. From the difference detected, PFD 12 generates difference signals. Difference signals generated include positive current source, UP, and negative current source, DN (or 'DOWN'). Current sources UP and DN provide input to charge pump 14. Using current sources UP and DN, charge pump 14 generates a proportional charge, VC. Thus, charge pump 14 provides voltage VC to voltage-controlled oscillator (VCO) 16. VCO 16 generates a periodic signal according to input voltage VC. The periodic signal, VCO_Out, may be referred to as either a frequency response or a frequency output interchangeably.

This periodic signal generated by VCO 16, VCO_Out, is input to configurable frequency divider 18. For example, when the frequency desired at PLL_Out is 1.0 GHz and VCO_Out frequency is between 0.5 GHz and 1.5 GHz, a dividing ratio of '1' is selected for divider 18. Alternately, if VCO_Out frequency is between 1.5 GHz and 2.5 GHz, a dividing ratio of '2' is selected for divider 18. As an example, configurable frequency divider 18 may be configured with a dividing ratio of 1, 2, or 3. The configurable dividing ratio may be set using configuration bits, Config_div<0:1>. For example, setting a dividing ratio may include blowing configuration fuses such that a dividing ratio remains fixed thereafter. As another example, configurable frequency divider 18 may be read from changeable configuration bits. The output of configurable frequency divider 18, PLL_Out, is provided to feedback divider 19 en route to the feedback input to PFD 12. Thus, PLL_Out is input to feedback divider 19, and FB_CLK is output from feedback divider 19.

Process variation affects the frequency output of the VCO of a PLL circuit, VCO_Out. Typically, PLL circuits having less process-induced variation have the higher frequency responses, while PLL circuits having more process-induced variation typically have lower frequency responses. There may be applications for low frequency response PLL circuits as well as high frequency response PLL circuits. Typically, high frequency response PLL circuits are more difficult to manufacture. Further, low frequency response PLL circuits may be configured from high frequency response PLL circuits through use of a configurable frequency divider 18, as shown in FIG. 1 and as described above.

Therefore, to fill the demand for low frequency response PLL circuits as well as high frequency response PLL circuits, it is desirable to design and manufacture primarily high frequency response PLL circuits having configurable frequency dividers. This approach may increase manufacturing yields. Further, this approach allows configuration of individual PLL circuits to meet existing PLL circuit demand.

Because process variation affects VCO_Out frequency, a dividing ratio for a single PLL in a process run typically can not be used as the dividing ratio for all of the multiple PLLs in that run. However, if process variation is negligible within a given processing unit, a single PLL within the processing unit may be evaluated to define a dividing ratio for the entire processing unit. A processing unit may be defined as, for example, a single lot of wafers, a single wafer, an area on a wafer, or even a single die. A processing unit may also be defined as a group of lots, wafers, or dies having some common processing parameters. For example, processing parameters may include processing machines, processing materials, and/or processing conditions.

Figure 2A:
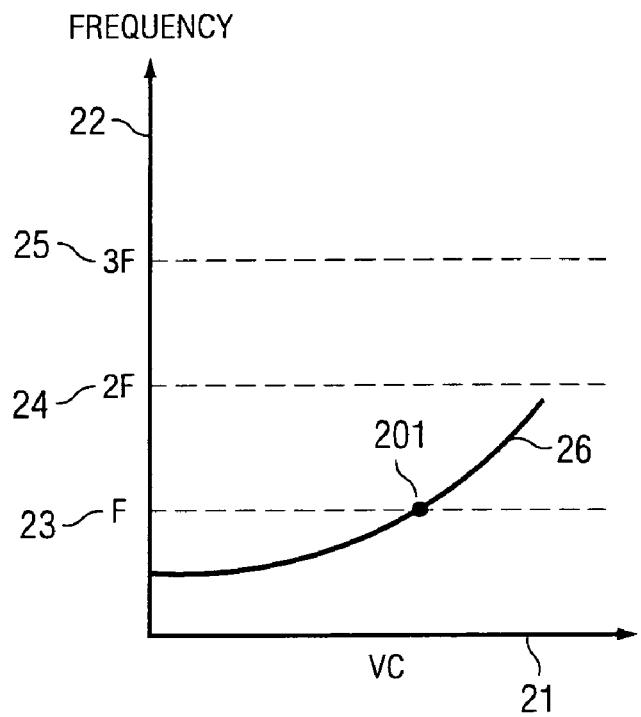
FIGS. 2A, 2B and 2C are graphical depictions of VCO frequency distributions for phase-locked loop circuits.
Figure 2B:
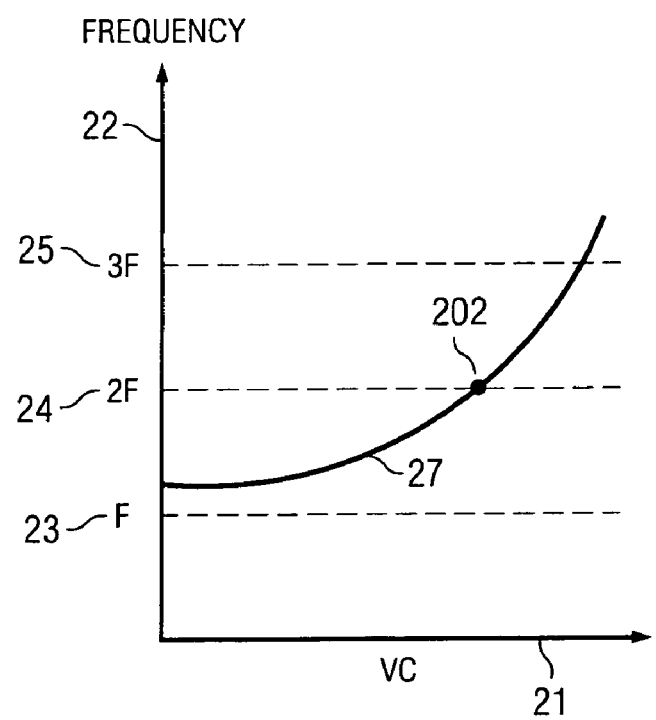
Figure 2C:
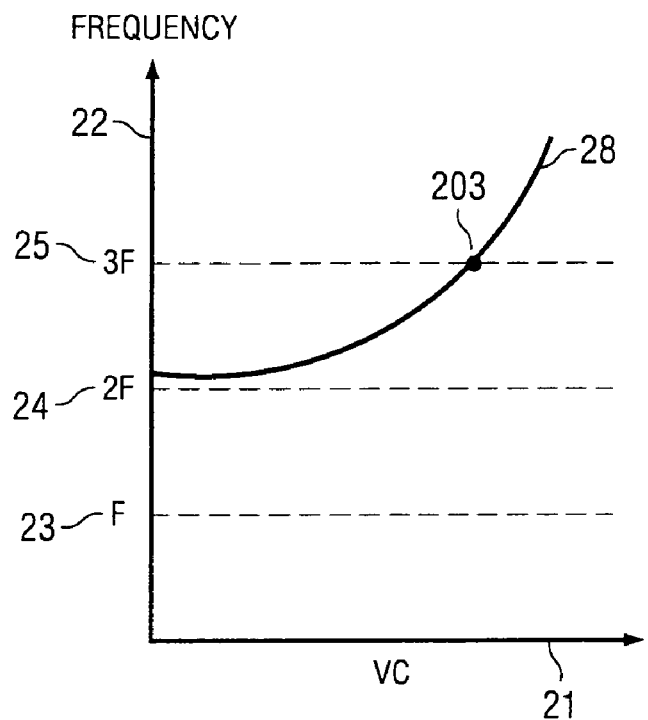

FIGS. 2A, 2B, and 2C are graphical depictions of VCO frequency distributions for phase-locked loop circuits. In the FIGS. 2A, 2B, and 2C, VCO_Out frequencies are process variation dependent. Thus, the various graphs may represent the variation of VCO output frequency inherent to a given manufacturing process. Further, each graph may represent PLL circuits within a given processing unit, as described above. Consequently, each graph may represent a group of PLL circuits for which a representative PLL circuit may be evaluated to determine the proper dividing ratio for each PLL within the group.

In each graph, the x-axis 21 represents voltage VC. Voltage VC is the input signal into VCO 16. The Y-axis 22 represents frequency. Curves 26, 27, and 28 represent VCO frequency output, VCO_Out, for FIGS. 2A, 2B, and 2C, respectively. The values "F" 23, "2F" 24, and "3F" 25 on Y-axis 22 are various target frequencies for PLL_Out, where PLL_Out is the output of configurable divider 18 and VCO_Out is the input of configurable divider 18.

Shown in FIGS. 2A, 2B, and 2C are exemplary frequency distributions of VCOs having characteristics which are within specification limits. Specification limits may be, for example, device-defined, process-defined, application-defined, or user-defined. In the example shown, less process variation results in faster output frequencies and vice versa. As described below, dividing ratios are determined for each frequency distribution such that a specific target frequency is achieved at PLL_Out.

FIG. 2A shows frequency distribution for VCOs having more process variation than VCOs shown in FIGS. 2B and 2C. For VCOs depicted by FIG. 2A, VCO_Out frequency at PLL lock may be "F", as indicated by point 201 arranged on VCO_Out distribution 26. A dividing ratio for configurable divider 18 can be selected such that divider output PLL_Out meets a specific target frequency on VCO_Out distribution 26. Target frequencies may include "F" 23, "2F" 24, and "3F" 25. Thus, dividing ratio '1' is appropriate for VCO_Out distribution 26 depicted by FIG. 2A, and VCOs depicted by FIG. 2A can achieve PLL_Out target frequency "F" 23.

FIG. 2B shows frequency distribution for VCOs having more typical process variation. For VCOs depicted by FIG. 2B, VCO_Out frequency at PLL lock may be "2F", as indicated by point 202 on VCO_Out distribution 27. VCO_Out distribution 27, depicted by FIG. 2B, would produce target PLL_Out distribution "F" 23 given a dividing ratio of '2'. Similarly, VCO_Out distribution 27 would produce a target PLL_Out distribution of "2F" 24 given a dividing ratio of '1'. Thus, the VCOs depicted by FIG. 2B can achieve PLL_Out target frequencies "2F" 24 and "F" 23.

FIG. 2C shows frequency distribution 28 for VCOs having the least process variation (as compared to FIGS. 2A and 2B). For VCOs depicted by FIG. 2C, VCO_Out frequency at PLL lock may be "3F", as indicated by point 203 on VCO_Out distribution 28. In FIG. 2C, VCO_Out frequency 28 is the highest (as compared to FIGS. 2A and 2B). VCO_Out distribution 28, depicted by FIG. 2C, would produce target PLL_Out distribution "F" 23 given a dividing ratio of '3'. Similarly, VCO_Out distribution 28 would produce a target PLL_Out distribution of "3F" 25 given a dividing ratio of '1'. Thus, the VCOs depicted by FIG. 2C can achieve PLL_Out target frequencies "3F" 25 and "F" 23.

Figure 3:
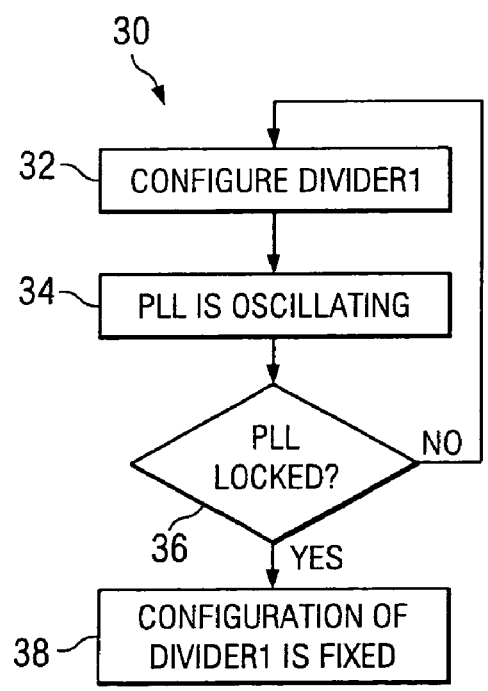
FIG. 3 is a flowchart for configuring a dividing ratio for a phase-locked loop circuit.

FIG. 3 is one embodiment of a flowchart 30 for a method of configuring a dividing ratio for a phase-locked loop circuit. A reasonable dividing ratio is configured in step 32. The time to perform this configuration is T_config. The PLL circuit oscillates at step 34 until it locks; this time may be referred to as T_lock. In many cases, T_lock will be less than 500 µs. A flag bit is checked at step 36 to determine whether the circuit has locked, and if so, PLL_Out frequency is measured and the dividing ratio configuration is fixed at step 38. T_diag is the time to check a flag bit to see if PLL is locked. After PLL locks, however, T_diag is the time to check the flag bit and the time to measure the frequency of PLL_Out. If the circuit has not locked, flowchart 30 repeats and another dividing ratio is configured at step 32. Once the circuit locks, execution of flowchart 30 terminates and the configuration of divider 18 is fixed at step 38.

In this test flow, the shortest test time occurs when the divider is configured correctly on the first try. Therefore, the best total test time, T_best, is:

$$T\_best = T\_config + T\_lock + T\_diag$$

where

T_config=time to configure PLL

T_lock=time to wait for the PLL to lock

T_diag=time to check for lock and, if locked, measure PLL_Out

Conversely, the worst test time occurs when the divider is configured correctly on the last try. Assuming 3 divider configurations, the worst total test time, T_worst, is:

$$T\_worst = 3 \times (T\_config + T\_lock + T\_diag)$$

T_lock is dominant in the test time of PLL. That is, T_lock is much greater than the other test times, thus a method to determine the correct dividing ratio without requiring PLL lock is desirable.

Figure 4:
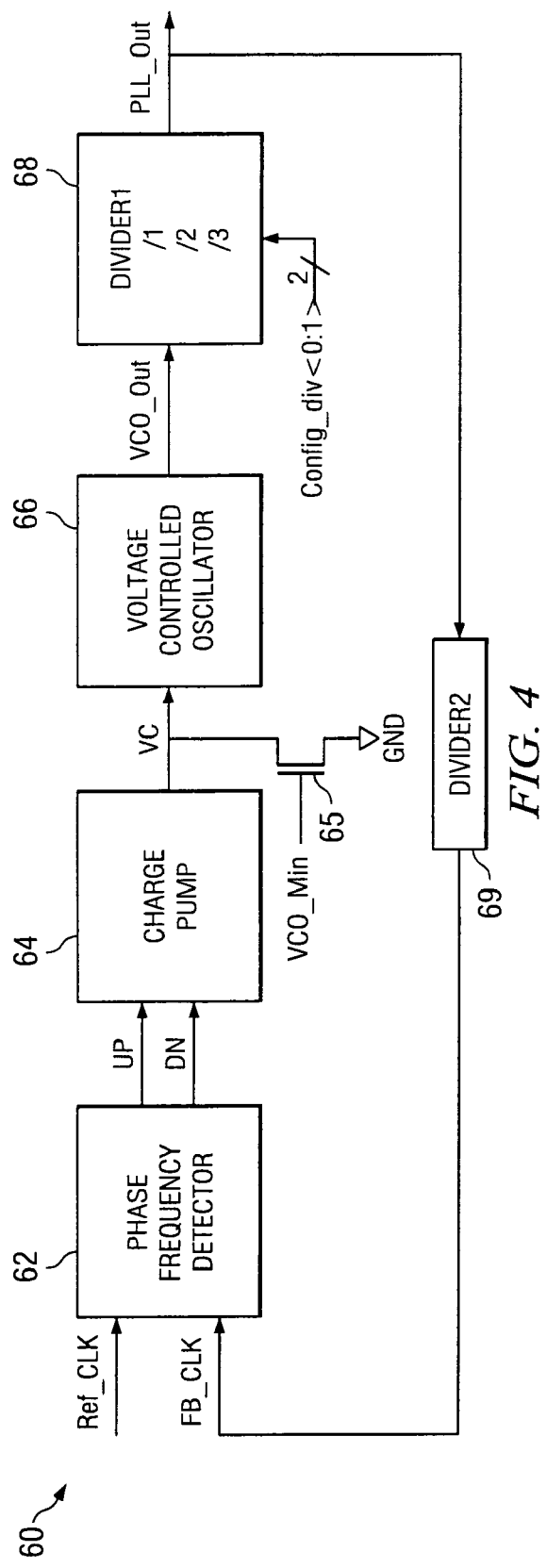
FIG. 4 is a block diagram of one embodiment of a phase-locked loop circuit according to the invention.

FIG. 4 is a block diagram of one embodiment of a phase-locked loop (PLL) circuit 60 that can be used in conjunction with the invention and that is adapted such that a relative minimum output frequency from VCO 66 may be determined without requiring PLL lock. A circuit device 65, which is shown as an NFET, is arranged between ground (GND) and the input node to voltage-controlled oscillator (VCO) 66. Circuit device 65 is operable to pull the voltage at the VCO input node to ground when the signal VCO_Min is asserted. Although NFET device 65 is shown, it is understood that other circuitry could be used having similar functionality and/or results as NFET 65.

Phase-locked loop 60 includes phase-frequency detector (PFD) 62. PFD 62 detects the difference in phases and frequencies of two input signals, Ref_CLK and FB_CLK. From the difference detected, PFD 62 generates difference signals. Difference signals generated include positive current source, UP, and negative current source, DN (or 'DOWN'). Current sources UP and DN provide input to charge pump 64. Using current sources UP and DN, charge pump 64 generates a proportional charge, VC. Thus, charge pump 64 provides voltage VC to voltage-controlled oscillator (VCO) 66. VCO 66 generates a periodic signal according to input voltage VC. This periodic signal generated by VCO 66, VCO_Out, is input to configurable frequency divider 68. The configurable dividing ratio may be set using configuration bits, Config_div<0:1>. The output of configurable frequency divider 68, PLL_Out, is provided to feedback divider 69 en route to the feedback input to PFD 62.

As noted, voltage VC at the input node of voltage-controlled oscillator 66 goes to ground when VCO_Min is asserted. When the input voltage to VCO 66 goes to ground, VCO output frequency, VCO_Out, goes to its minimum. However, PLL circuit 60 operates normally when NFET 65 is not active. That is, PLL 60 operates normally when VCO_Min is not asserted, as shown in Table 1.

TABLE 1

| VCO_Min | VCO_Out |
|---------|---------|
| High | Minimum Frequency |
| Low | Normal Operation |

Thus, the relative minimum frequency of PLL circuit 60 may be determined during manufacturing test without requiring lock of PLL circuit 60. Further, a preliminary PLL characterization assessment may predict a frequency range of PLL 60.

Figure 5:
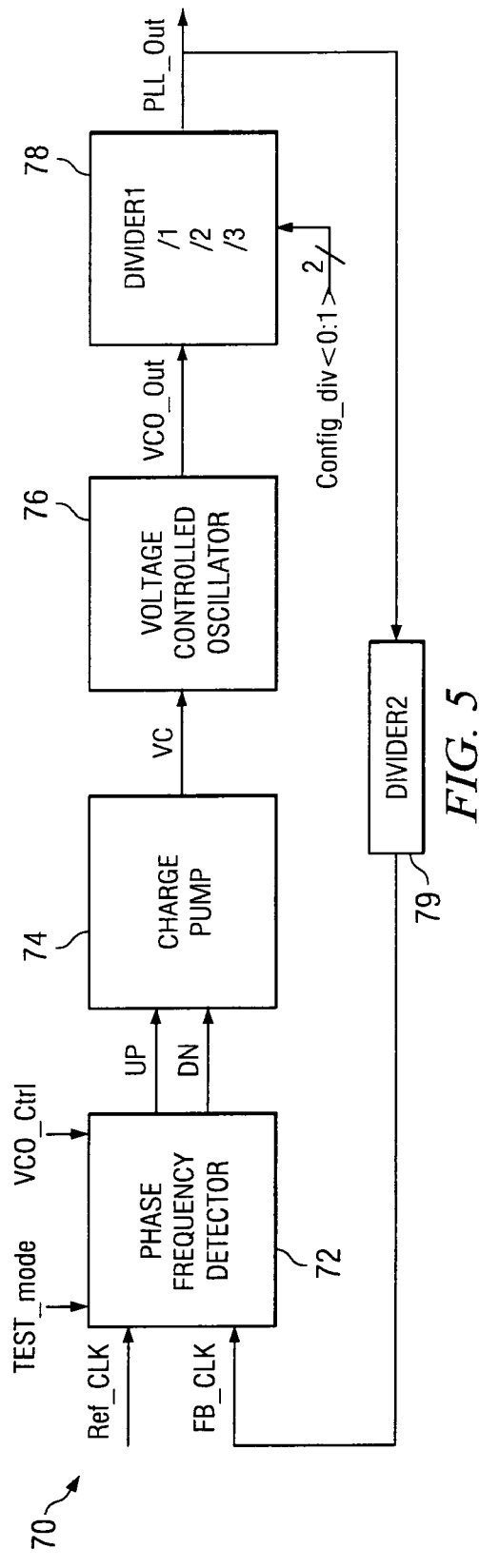
FIG. 5 is a block diagram of one embodiment of a phase-locked loop circuit according to the invention.

FIG. 5 is a block diagram of another embodiment of a phase-locked loop (PLL) circuit 70 that can be used in conjunction with the invention. Phase-locked loop 70 includes phase-frequency detector (PFD) 72, which detects phase and frequency differences of two input signals, Ref_CLK and FB_CLK, and generates difference signals UP and DN. Positive current source, UP, and negative current source, DN (or 'DOWN') provide input to charge pump 74. Using current sources UP and DN, charge pump 74 generates a proportional charge, VC. Thus, charge pump 74 provides voltage VC to voltage-controlled oscillator (VCO) 76. VCO 76 generates a periodic signal according to input voltage VC. Periodic signal VCO_Out is input to configurable frequency divider 78. The configurable dividing ratio may be set using configuration bits, Config_div<0:1>. The output of configurable frequency divider 78, PLL_Out, is provided to feedback divider 79 en route to the feedback input to PFD 72.

Phase-locked loop 70 is adapted such that a relative minimum or relative maximum output frequency of VCO 76 may be determined without requiring PLL lock. In one embodiment, two signals are added to the PLL circuit 70, TEST_mode and VCO_Ctrl. Through these signals, an output from PLL 70 is controlled as indicated by Table 2.

TABLE 2

| TEST_mode | VCO_Ctrl | VCO_Out |
|-----------|----------|---------|
| Low | — | Normal Operation |
| High | Low | Minimum Frequency |
| High | High | Maximum Frequency |

VCO output frequency, VCO_Out, can be controlled using signals TEST_mode and VCO_Ctrl. As shown, when TEST_mode is high and VCO_Ctrl is low, VCO output frequency approaches a minimum. However, when TEST_mode and VCO_Ctrl are both high, VCO output frequency approaches a maximum. Yet, when TEST_mode is low, PLL 70 operates normally.

In the embodiment shown in FIG. 5, control signals TEST_mode and VCO_Ctrl are input to the phase-frequency detector (PFD) 72. In this embodiment, PFD 72 is adapted to allow the control signals TEST_mode and VCO_Ctrl to manipulate the UP and DN (or 'DOWN') output signals, thus producing the results indicated in Table 2. For example, when control signals TEST_mode is high and VCO_Ctrl is low, PFD 72 may be adapted such that positive current source UP is fixed to GND and negative current source DN is fixed to VDD, thus resulting in a relative minimum VCO_Out frequency. As another example, when TEST_mode and VCO_Ctrl are both high, PFD 72 may be adapted such that positive current source UP is fixed to VDD and negative current source DN is fixed to GND, resulting in a relative maximum VCO_Out frequency.

Adapting phase-frequency detector 72 to allow the control signals TEST_mode and VCO_Ctrl to manipulate the UP and DN (or 'DOWN') output signals may include, for example, reconfiguring existing logic gates and/or switches which comprise PFD 72. Adapting phase-frequency detector 72 may also include incorporating additional logic gates and/or switches into the existing circuitry which constitutes PFD 72.

In alternate embodiments, similar results may be obtained without providing both, or either, of control signals TEST_mode and VCO_Ctrl directly to PFD 72. In one embodiment, an asserted TEST_mode signal may allow direct manipulation of the UP and DN input nodes to charge pump 74, bypassing PFD 72 entirely. Direct manipulation of input nodes UP and DN may be performed, for example, by circuitry added to PLL 70. In another embodiment, given access to the appropriate nodes, direct manipulation of charge pump inputs UP and DN may be performed without adding additional circuitry to PLL 70. Such manipulation may be performed directly, for example, by a tester such as those used in semiconductor manufacturing facilities.

It is noted that an induced (i.e., relative maximum or relative minimum) frequency may be attained without fixing charge pump inputs to either VDD or ground. That is, charge pump inputs may be pulled high or low in lieu of fixing to VDD or ground, respectively, with approximately the same eventual voltage response, VC. Because VCO_Out is a function of voltage VC, pulling charge pump inputs high or low in lieu of fixing to VDD or ground, respectively, will result in substantially the same eventual VCO_Out frequency response. Although pulling charge pump inputs high or low may not change the VCO_Out frequency response as quickly as fixing inputs to VDD or ground, this method of determining relative minimum and/or relative maximum VCO_Out frequency response may be preferred. Further, it is noted that given either relative maximum or relative minimum VCO_Out frequency, a preliminary PLL characterization assessment may predict the frequency range of the PLL.

Figure 6A:
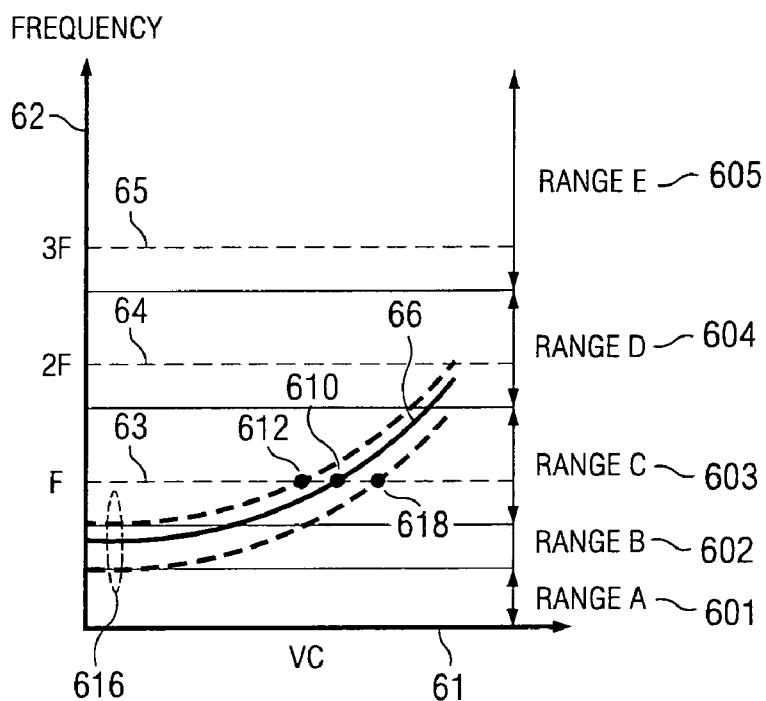
FIG. 6A, 6B and 6C are graphical depictions of VCO frequency distributions for phase-locked loop circuits.
Figure 6B:
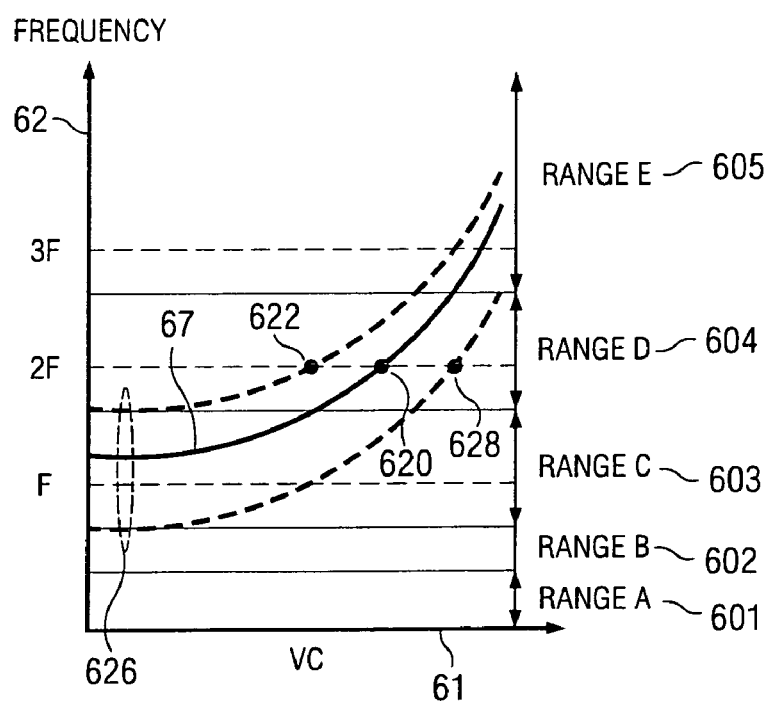
Figure 6C:
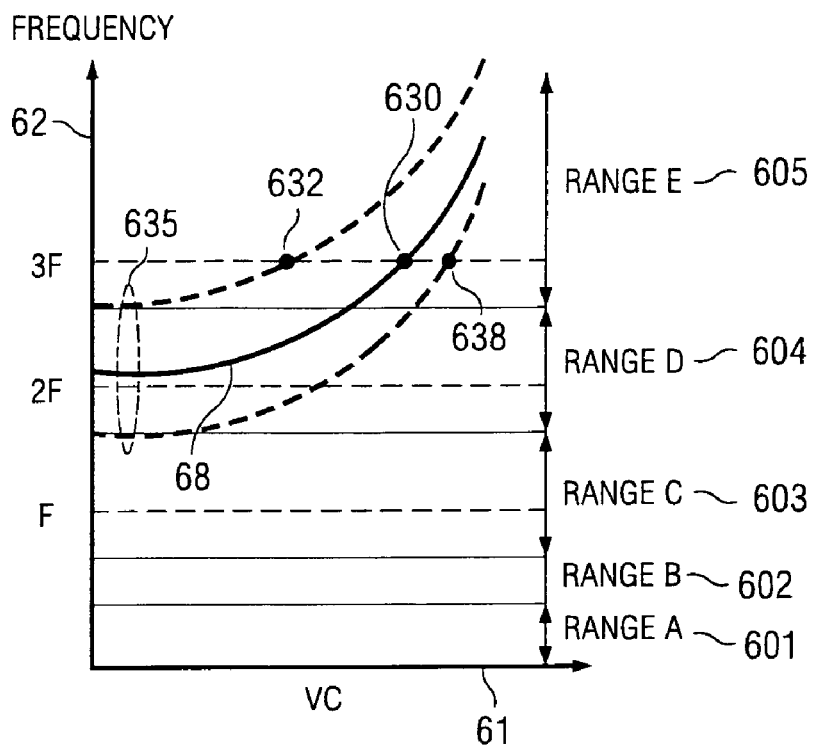

FIGS. 6A, 6B, and 6C are graphical depictions of VCO frequency ranges and distributions for phase-locked loop circuits in accordance with the present invention. In the FIGS. 6A, 6B, and 6C, VCO_Out frequencies are process variation dependent. Thus, the various graphs may represent the variation of VCO output frequency inherent to a given manufacturing process. Further, each graph may represent PLL circuits within a given processing unit, as described above. Consequently, each graph may represent a group of PLL circuits for which a representative PLL circuit may be evaluated to determine the proper dividing ratio for each PLL within the group. In particular, a frequency response, VCO_Out, may be induced from a representative PLL circuit using a circuit and/or method as described above in reference to FIGS. 4 and 5. The induced frequency response VCO_Out may be used to choose the most suitable dividing ratio for the group of PLL circuits corresponding to the representative PLL circuit as described below.

In FIGS. 6A, 6B, and 6C, the x-axis 61 represents voltage VC. Voltage VC is the input signal into a VCO, such as VCO 62 as shown in FIG. 4 or VCO 72 as shown in FIG. 5. The Y-axis 62 represents frequency. Curves 66, 67, and 68 represent VCO frequency output, VCO_Out, for the groups of PLL circuits represented by FIGS. 6A, 6B, and 6C, respectively. The values "F" 63, "2F" 64, and "3F" 65 on Y-axis 62 are various target frequencies for PLL_Out, where PLL_Out may be, for example, the output of configurable divider 68 or 78 in FIGS. 4 or 5, respectively.

Shown in FIGS. 6A, 6B, and 6C are exemplary VCO ranges and frequency distributions which are within specification limits. In the example shown, frequency Ranges B 602, C 603, and D 604 are within specification, while frequency Ranges A 601 and E 605 are out of specification. As described below, dividing ratios are determined for PLL circuits having VCO_Out frequency responses which are within specification. In particular, dividing ratios are determined from induced frequency responses, and more particularly, dividing ratios can be determined from substantially minimum frequency responses such that a target frequency of "F" 63 is attained. Table 3 shows correlation table used to determine the dividing ratios.

TABLE 3

| Min-Frequency | Divider Ratio |
| --- | --- |
| Range A | n/a |
| Range B | /1 |
| Range C | /2 |
| Range D | /3 |
| Range E | n/a |

FIG. 6A shows frequency distributions for VCOs having substantially minimum frequency responses 616 within frequency Range B 602. A substantially minimum frequency response may be induced by pulling voltage VC to or near ground, i.e., zero volts. Thus, the minimum frequencies 616 for the group of PLL circuits represented by FIG. 6A are arranged along or near y axis 62. Curve 66 represents VCO frequency output, VCO_Out, for the group of PLL circuits represented by FIG. 6A. Point 610 arranged along curve 66 represents a substantially average PLL lock frequency and Points 612 and 618 represent respective substantially minimum and substantially maximum PLL lock frequencies for this group of PLL circuits. Because the minimum frequencies 616 for the group of PLL circuits represented by FIG. 6A are within Range B 602, a dividing ratio of '1' is indicated in the correlation table shown in Table 3. Therefore, the dividing ratio of '1' is chosen for each PLL circuit within the group of PLL circuits represented by FIG. 6A.

FIG. 6B shows frequency distributions for VCOs having substantially minimum frequency responses 626 within frequency Range C 603. Since substantially minimum frequency responses are induced by pulling voltage VC to or near zero volts, minimum frequencies 626 for the group of PLL circuits represented by FIG. 6B are arranged along or near y axis 62. Curve 67 represents VCO frequency output, VCO_Out, for the group of PLL circuits represented by FIG. 6B. Point 620 arranged along curve 67 represents a substantially average PLL lock frequency and Points 622 and 628 represent respective substantially minimum and substantially maximum PLL lock frequencies for this group of PLL circuits. Because the minimum frequencies 626 for the group of PLL circuits represented by FIG. 6B are within Range C 603, a dividing ratio of '2' is indicated in the correlation table shown in Table 3. Therefore, the dividing ratio of '2' is chosen for each PLL circuit within the group of PLL circuits represented by FIG. 6B.

FIG. 6C shows frequency distributions for VCOs having substantially minimum frequency responses 626. Since substantially minimum frequency responses are induced by pulling voltage VC to or near zero volts, minimum frequencies 635 for the group of PLL circuits represented by FIG. 6C are arranged along or near y axis 62. Curve 68 represents VCO frequency output, VCO_Out, for the group of PLL circuits represented by FIG. 6C. Point 630 arranged along curve 68 represents a substantially average PLL lock frequency and Points 632 and 638 represent respective substantially minimum and substantially maximum PLL lock frequencies for this group of PLL circuits. Because the minimum frequencies 635 for the group of PLL circuits represented by FIG. 6C are within Range D 604, a dividing ratio of '3' is indicated in the correlation table shown in Table 3. Therefore, the dividing ratio of '3' is chosen for each PLL circuit within the group of PLL circuits represented by FIG. 6C.

Similarly, ranges for maximum VCO output frequency may be defined and correlated to dividing ratios. Further, it is noted that it may be possible to add another divider or another dividing ratio in order to increase process yields in the case of VCO output frequencies which exceed the upper specification limit.

Figure 7:
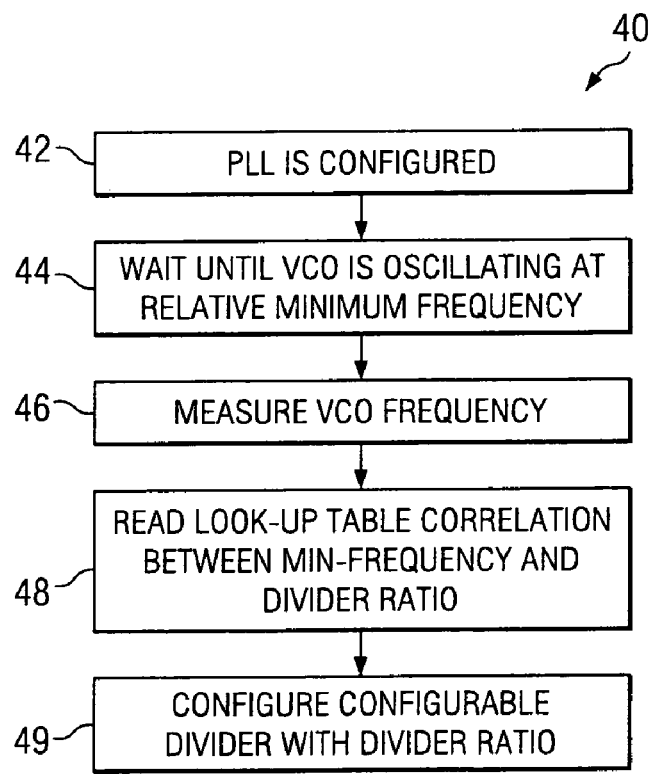
FIG. 7 is a flowchart for one embodiment of a method for determining an appropriate dividing ratio.

In FIG. 7, flowchart 40 depicts one embodiment of a methodology to determine an appropriate dividing ratio without requiring PLL lock (e.g., in a manufacturing test environment). The PLL is configured to be tested in step 42; this configuration time is denoted as T_config. The test configuration may include a PLL test circuit arrangement similar to those shown in either of FIGS. 4 or 5. The PLL test circuit is configured to cause the VCO output frequency of the PLL under test to go to an extreme. Therefore, the VCO output frequency approaches either a relative minimum or a relative maximum for the PLL under test.

The induced frequency output may be measured after some settling time and is either a minimum output frequency or a maximum output frequency for the PLL under test. For example, a minimum output frequency may be a substantially minimum output frequency due to, for example, noise or margin of error in measurement. A substantially minimum output frequency may be, for example, an average of the measured minimum frequencies taken over some time following some settling time.

The PLL test circuit begins operating and at step 44 a period of waiting occurs until the VCO output frequency, VCO_Out, reaches a relative minimum (for the embodiment of FIG. 7). The time for settling is denoted T_wait and is, for example, less than approximately 100 µs. VCO_Out is measured at step 46. The time to measure VCO_Out, T_meas, is less than, for example, approximately 300 µs. At step 48, VCO_Out is correlated with a dividing ratio. For example, the measured frequency may be looked up on a correlation table such as Table 3, shown above, and the dividing ratio which correlates to the measured frequency may be read. The time to correlate the measured frequency with a dividing ratio, T_refer, is, for example, less than approximately 100 µs. At step 49, the configurable divider is configured with the dividing ratio. The time to perform this test methodology to determine an appropriate dividing ratio without requiring PLL lock, T_inven, is:

$$T\_inven = T\_config + T\_wait + T\_meas + T\_refer$$

where
T_config=time to configure PLL.
T_wait=time for VCO frequency to settle to a relative extreme.
T_meas=time to measure the extreme frequency of the VCO.
T_refer=time to correlate frequency with a dividing ratio.

T_lock is dominant in the test time of PLL (i.e., T_inven≦T_best<<T_worst).

Generally, T_lock is greater than T_wait+T_meas+T_refer. Therefore, T_inven is smaller than T_best. Consequently, this methodology of configuring the dividing ratio is faster than a method requiring PLL lock.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component of any or all the claims.

What is claimed is:

1. A method for configuring a phase-locked loop circuit (PLL), said method comprising:

inducing a frequency output from a voltage-controlled oscillator, wherein said frequency output comprises a substantially minimum or a substantially maximum for the voltage-controlled oscillator and said inducing comprises manipulating inputs to a charge pump, wherein the charge pump is configured to provide input to the voltage-controlled-oscillator;

asserting a test signal prior to said inducing, wherein said PLL operates normally when a test signal is unasserted:

providing a control signal, wherein the frequency output is a minimum frequency when the control signal is unasserted, and wherein the frequency output is a maximum frequency when the control signal is asserted;

configuring a phase-frequency-detector, wherein the phase-frequency-detector has outputs coincident with inputs to the charge pump, and wherein said configuring comprises adapting to receive as inputs said test signal and said control signal; and configuring a divider, wherein said configuring comprises setting a dividing ratio based on said frequency output, wherein said configuring comprises measuring said frequency output and selecting a dividing ratio based on said measured frequency output.

2. The method of claim 1, wherein said frequency output is a minimum frequency output, and wherein said selecting a dividing ratio comprises selecting a dividing ratio which correlates to the measured minimum frequency output.

3. The method of claim 1, wherein said configuring comprises measuring said frequency output and selecting a dividing ratio based on said measured frequency output, wherein said frequency output is a minimum frequency output, and wherein said selecting a dividing ratio comprises selecting a dividing ratio which correlates to the measured minimum frequency output.

4. The method of claim 3, wherein said inducing comprises pulling to ground an input voltage to the voltage-controlled-oscillator.

5. The method of claim 4, wherein said pulling to ground comprises providing a test signal, and wherein the input voltage to the voltage-controlled-oscillator is pulled to ground when the test signal is asserted.

6. The method of claim 5, wherein the test signal gates circuitry arranged between an input voltage node to the voltage-controlled-oscillator and ground.

7. A method for configuring a phase-locked loop circuit (PLL), said method comprising:
  inducing a frequency output from a voltage-controlled oscillator;
  measuring the frequency output from the voltage-controlled oscillator;
  analyzing the frequency output, wherein said analyzing comprises referring to a correlation table and selecting a dividing ratio from the correlation table which correlates to the frequency output;
  providing a control signal, wherein the frequency output is a substantially minimum frequency when the control signal is unasserted, and wherein the frequency output is a substantially maximum frequency when the control signal is asserted; and wherein said inducing comprises manipulating inputs to a charge pump having an output commensurate with an input to the voltage-controlled oscillator;
  configuring a phase-frequency-detector, wherein the phase-frequency-detector has outputs coincident with inputs to the charge pump, and wherein said configuring comprises adapting to receive as inputs said test signal and said control signal; and
  configuring a divider based on said output, wherein said configuring comprises setting a dividing ratio.

8. The method of claim 7, wherein said inducing comprises minimizing an input voltage into the voltage-controlled oscillator, and wherein said frequency output is a substantially minimum frequency.

9. A system for configuring a phase-locked loop circuit (PLL), said system comprising:
  a voltage-controlled oscillator configured to provide a frequency output when a test-signal is asserted; and
  a configurable divider, wherein a dividing ratio is configured based upon the frequency output; wherein the divider comprises fuse bits adapted to set the dividing ratio.

10. The system of claim 9, wherein the voltage-controlled oscillator provides a substantially minimum or substantially maximum frequency the voltage-controlled oscillator is capable of providing.

11. The system of claim 9, further comprising circuitry electrically coupled between an input node of the voltage-controlled oscillator and ground, and wherein a test-signal gates the circuitry.

12. The system of claim 11, further comprising a charge pump configured to provide a substantially minimum or a substantially maximum voltage output to a voltage-controlled-oscillator input.

13. The system of claim 9, further comprising a phase-frequency detector adapted to receive as inputs the test-signal and a control signal, wherein the frequency output is a minimum frequency when the control signal is unasserted, and wherein the frequency output is a maximum frequency when the control signal is asserted.

* * * * *